(12) United States Patent
Peng et al.

(10) Patent No.: US 11,456,706 B2
(45) Date of Patent: Sep. 27, 2022

(54) AUDIO PROCESSOR CIRCUIT AND AUDIO PROCESSING METHOD

(71) Applicant: Realtek Semiconductor Corporation, Hsinchu (TW)

(72) Inventors: Chun-Hao Peng, Hsinchu (TW); Tsung-Peng Chuang, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 1 day.

(21) Appl. No.: 17/333,210

(22) Filed: May 28, 2021

(65) Prior Publication Data

US 2022/0166387 A1  May 26, 2022

(30) Foreign Application Priority Data

Nov. 25, 2020 (TW) .................. 109141313

(51) Int. Cl.
*H03F 1/26* (2006.01)
*H03F 3/181* (2006.01)

(52) U.S. Cl.
CPC ......... *H03F 1/26* (2013.01); *H03F 2200/372* (2013.01)

(58) Field of Classification Search
CPC ...... H03F 1/26; H03F 2200/372; H03F 3/183; H04N 21/4392
USPC .................................................. 330/149, 253
See application file for complete search history.

(56) References Cited

U.S. PATENT DOCUMENTS 9,590,648 B2* 3/2017 La Grou ................. H03M 1/08

FOREIGN PATENT DOCUMENTS

| CN | 101004941 A | 7/2007 |
|----|-------------|--------|
| JP | H01213036 A | 8/1989 |
| JP | H0620377 A  | 1/1994 |
| JP | H06176493 A | 6/1994 |
| JP | H1093927 A  | 4/1998 |
| JP | 2001111499 A | 4/2001 |
| JP | 2008269750 A | 11/2008 |

* cited by examiner

*Primary Examiner* — Hieu P Nguyen
(74) *Attorney, Agent, or Firm* — Locke Lord LLP; Tim Tingkang Xia, Esq.

(57) ABSTRACT

An audio processor circuit includes a storage circuit, a digital-to-analog converter circuit, and an amplifier circuit. The storage circuit is configured to store digital audio data from an electrical device. The digital-to-analog converter circuit is configured to convert the digital audio data from the storage circuit into an analog audio signal. The amplifier circuit is configured to provide an output audio signal to an audio playing circuit according to the analog audio signal. If a total data volume of the digital audio data stored in the storage circuit is not a multiple of a throughput or the total data volume of the digital audio data stored in the storage circuit is equal to or greater than an upper limit value, the amplifier circuit is turned off such that the amplifier circuit stops providing the output audio signal to the audio playing circuit.

20 Claims, 7 Drawing Sheets

AUDIO PROCESSOR CIRCUIT AND AUDIO PROCESSING METHOD

RELATED APPLICATIONS

This application claims priority to Taiwanese Application Serial Number 109141313, filed Nov. 25, 2020, which is herein incorporated by reference.

BACKGROUND

Technical Field

The present disclosure relates to audio technology. More particularly, the present disclosure relates to an audio processor circuit and an audio processing method for reducing noise.

Description of Related Art

With developments of technology, many electrical devices can support audio playing functions. However, in some application scenarios, due to some factors (e.g., poor circuit design on a circuit board, impedance mismatch, and unstable power supply/audio data/clock signal), audio data may be lost or overflowed, and thus noise is generated e.g., during decoding, and affects user's hearing experience.

SUMMARY

Some aspects of the present disclosure are to provide an audio processor circuit. The audio processor circuit includes a storage circuit, a digital-to-analog converter circuit, and an amplifier circuit. The storage circuit is configured to store digital audio data from an electrical device. The digital-to-analog converter circuit is configured to convert the digital audio data from the storage circuit into an analog audio signal. The amplifier circuit is configured to provide an output audio signal to an audio playing circuit according to the analog audio signal. If a total data volume of the digital audio data stored in the storage circuit is not a multiple of a throughput or the total data volume of the digital audio data stored in the storage circuit is equal to or greater than an upper limit value, the amplifier circuit is turned off such that the amplifier circuit stops providing the output audio signal to the audio playing circuit.

Some aspects of the present disclosure are to provide an audio processing method. The audio processing method includes following operations: storing, by a storage circuit, digital audio data from an electrical device; converting, by a digital-to-analog converter circuit, the digital audio data from the storage circuit into an analog audio signal; providing, by an amplifier circuit, an output audio signal to an audio playing circuit according to the analog audio signal; and turning off the amplifier circuit such that the amplifier circuit stops providing the output audio signal to the audio playing circuit if a total data volume of the digital audio data stored in the storage circuit is not a multiple of a throughput or the total data volume of the digital audio data stored in the storage circuit is equal to or greater than an upper limit value.

Based on the descriptions above, the audio processor circuit and the audio processing method of the present disclosure can prevent the user from hearing noise so as to improve the user's hearing experience.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
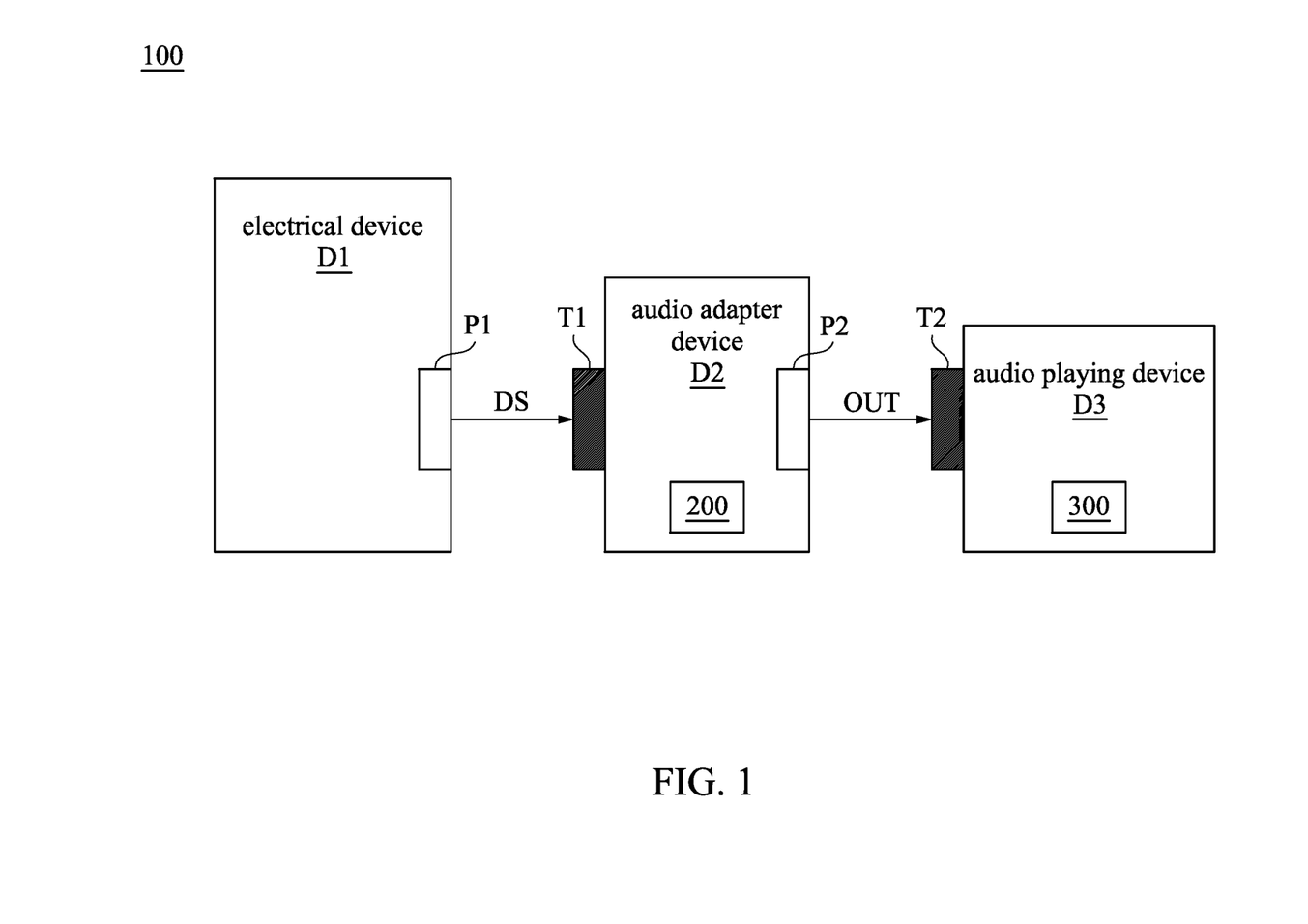
FIG. 1 is a schematic diagram illustrating an audio playing system according to some embodiments of the present disclosure.

Reference is made to FIG. 1. FIG. 1 is a schematic diagram illustrating an audio playing system 100 according to some embodiments of the present disclosure. As illustrated in FIG. 1, the audio playing system 100 includes an electrical device D1, an audio adapter device D2, and an audio playing device D3. The audio adapter device D2 can be coupled between the electrical device D1 and the audio playing device D3.

In some embodiments, the electrical device D1 may be a cell phone, a laptop, a tablet, or other electrical apparatuses which can provide audio data. The audio adapter device D2 may be an audio dongle. The audio playing device D3 may be headphones/earphones, a speaker, or other playing apparatuses with audio playing functions.

The aforementioned implementations of the electrical device D1, the audio adapter device D2, and the audio playing device D3 are merely for illustration, and various implementations of the electrical device D1, the audio adapter device D2, and the audio playing device D3 are within the contemplated scopes of the present disclosure.

As described above, the audio adapter device D2 can be coupled between the electrical device D1 and the audio playing device D3. As illustrated in FIG. 1, the electrical device D1 includes a connection portion P1, the audio adapter device D2 includes a connection portion T1 and a connection portion P2, and the audio playing device D3 includes a connection portion T2. In some embodiments, a type of the connection portion T1 corresponds to that of the connection portion P1, and a type of the connection portion T2 corresponds to that of the connection portion P2. For example, the connection portion P1 is a female connector with Type-C standard, the connection portion T1 is a male connector with Type-C standard, and the connection portion T1 can be inserted into the connection portion P1. The connection portion P2 is a headphones/earphones jack, the connection portion T2 is a headphones/earphones plug, and the connection portion T2 can be inserted into the connection portion P2.

In some embodiments, the electrical device D1 can be connected to an audio platform to receive audio data from the audio platform. Then, the electrical device D1 can output digital audio data DS to the audio adapter device D2 according to the audio data from the audio platform. In some other embodiments, the digital audio data DS is stored in the electrical device D1.

As illustrated in FIG. 1, the audio adapter device D2 includes an audio processor circuit 200. The audio processor circuit 200 can generate an output audio signal OUT according to the digital audio data DS, and provide the output audio signal OUT to an audio playing circuit 300 in the audio playing device D3. Then, the audio playing circuit 300 can play corresponding audio according to the output audio signal OUT.

Figure 2:
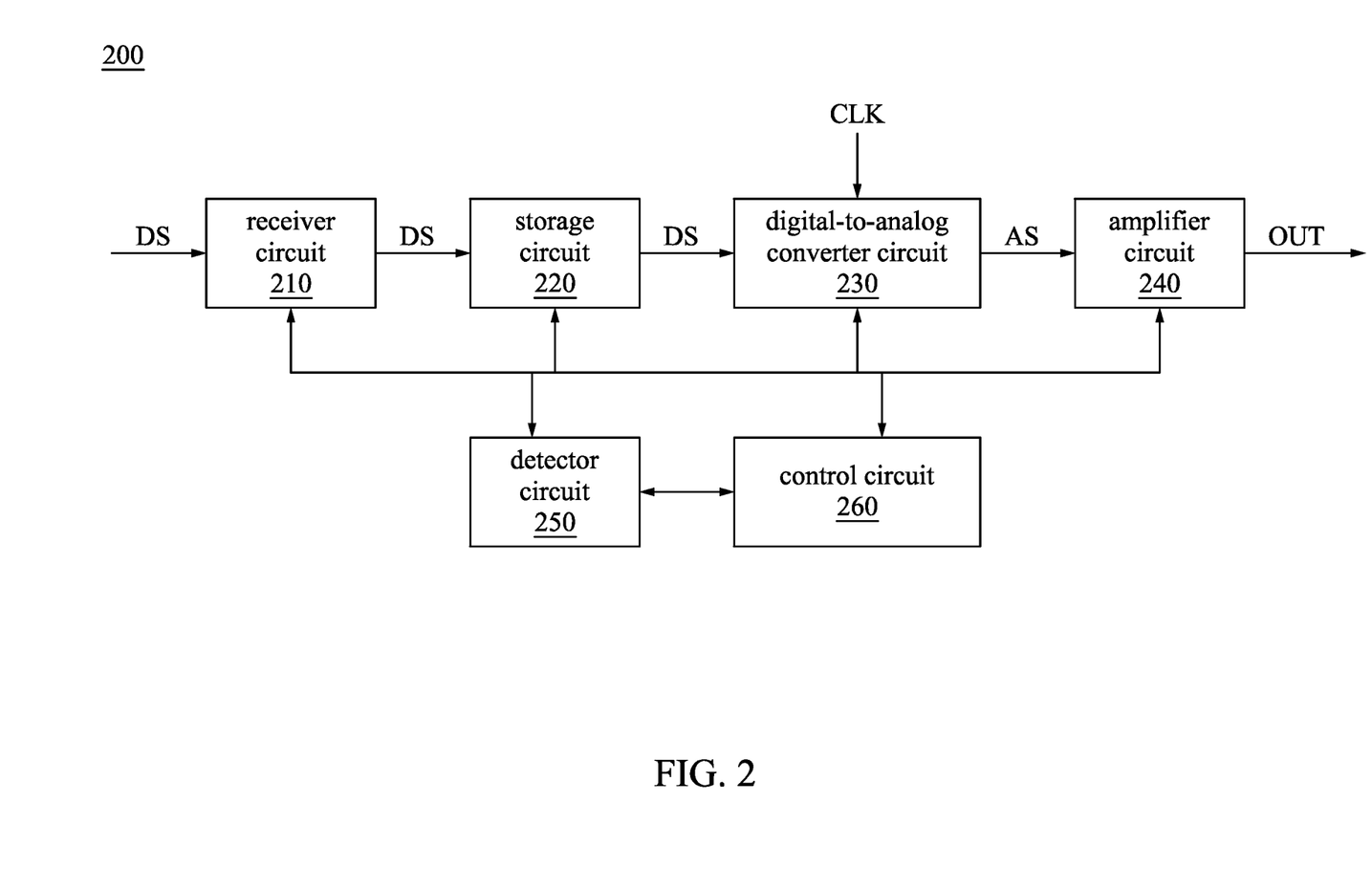
FIG. 2 is a functional block diagram illustrating an audio processor circuit according to some embodiments of the present disclosure.

Reference is made to FIG. 2. FIG. 2 is a functional block diagram illustrating the audio processor circuit 200 according to some embodiments of the present disclosure. As illustrated in FIG. 2, the audio processor circuit 200 includes a receiver circuit 210, a storage circuit 220, a digital-to-analog converter circuit 230, an amplifier circuit 240, a detector circuit 250, and a control circuit 260.

The storage circuit 220 is coupled to the receiver circuit 210. The digital-to-analog converter circuit 230 is coupled to the storage circuit 220. The amplifier circuit 240 is coupled to the digital-to-analog converter circuit 230. The detector circuit 250 and the control circuit 260 are coupled to the receiver circuit 210, the storage circuit 220, the digital-to-analog converter circuit 230, and the amplifier circuit 240.

In some embodiments, the receiver circuit 210 may be a PHY circuit. The storage circuit 220 may be a register that can perform a first-in-first-out (FIFO) process. The amplifier circuit 240 may be an audio amplifier. The control circuit 260 may be a micro controller unit (MCU).

The aforementioned implementations of the receiver circuit 210, the storage circuit 220, the amplifier circuit 240, and the control circuit 260 are merely for illustration, and various implementations of the storage circuit 220, the amplifier circuit 240, and the control circuit 260 are within the contemplated scopes of the present disclosure.

Figure 3:
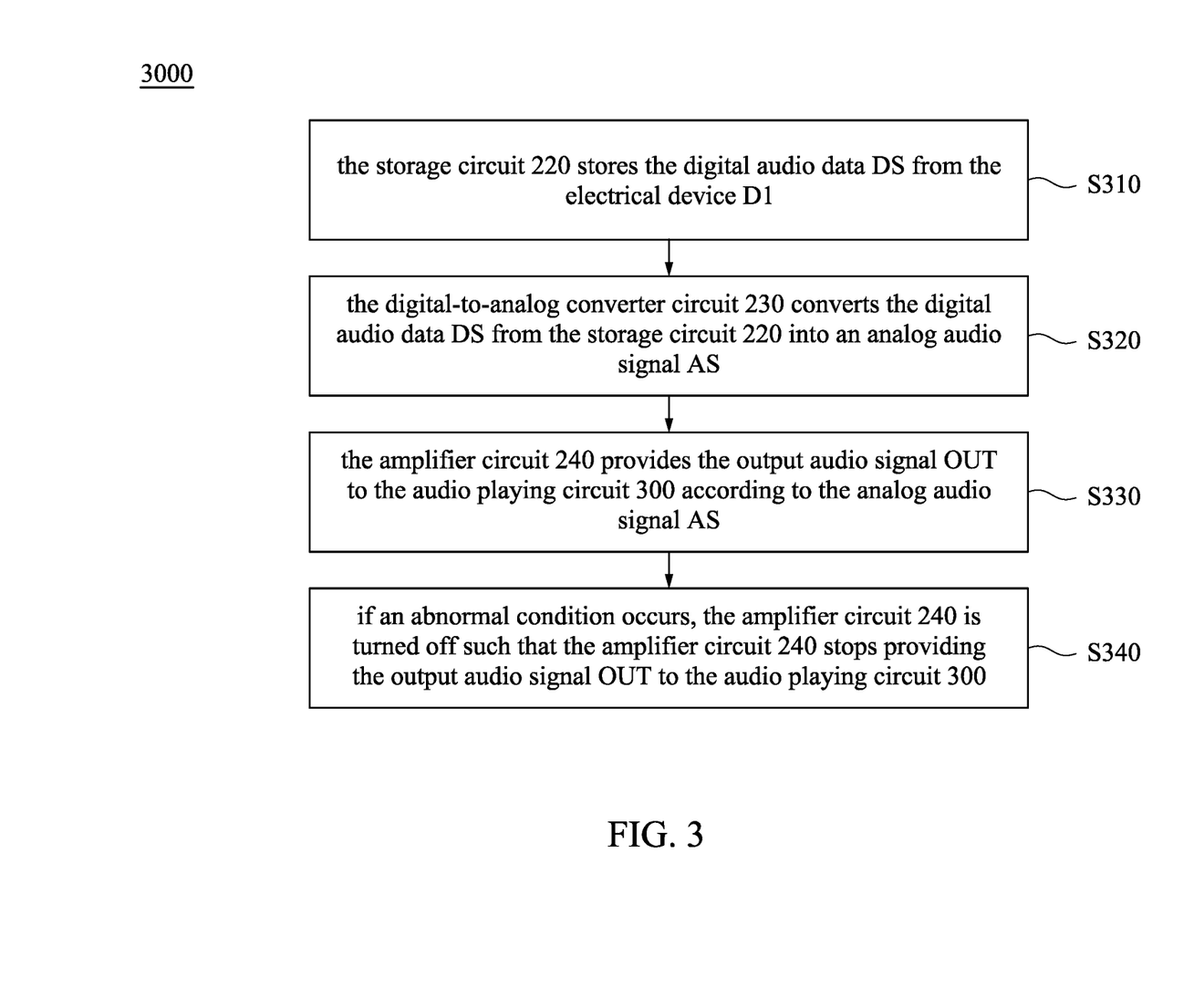
FIG. 3 is a flow diagram illustrating an audio processing method according to some embodiments of the present disclosure.

References are made to FIGS. 1-3. FIG. 3 is a flow diagram illustrating an audio processing method 3000 according to some embodiments of the present disclosure. The audio processing method 3000 includes operations S310, S320, S330, and S340.

In operation S310, the storage circuit 220 stores the digital audio data DS from the electrical device D1. For example, the receiver circuit 210 receives the digital audio data DS from the electrical device D1 first, and then the receiver circuit 210 transmits the digital audio data DS to the storage circuit 220 in order to store the digital audio data DS in the storage circuit 220.

In operation S320, the digital-to-analog converter circuit 230 converts the digital audio data DS from the storage circuit 220 into an analog audio signal AS. For example, the digital-to-analog converter circuit 230 receives the digital audio data DS stored in the storage circuit 220 according to a clock signal CLK, and converts the received digital audio data DS into an analog form in order to generate the analog audio signal AS.

In operation S330, the amplifier circuit 240 provides the output audio signal OUT to the audio playing circuit 300 according to the analog audio signal AS. For example, the amplifier circuit 240 receives the analog audio signal AS and provides the output audio signal OUT to the audio playing circuit 300 according to the analog audio signal AS such that the audio playing device D3 can play corresponding audio according to the output audio signal OUT.

In operation S340, if an abnormal condition occurs, the amplifier circuit 240 is turned off such that the amplifier circuit 240 stops providing the output audio signal OUT to the audio playing circuit 300.

Figure 4:
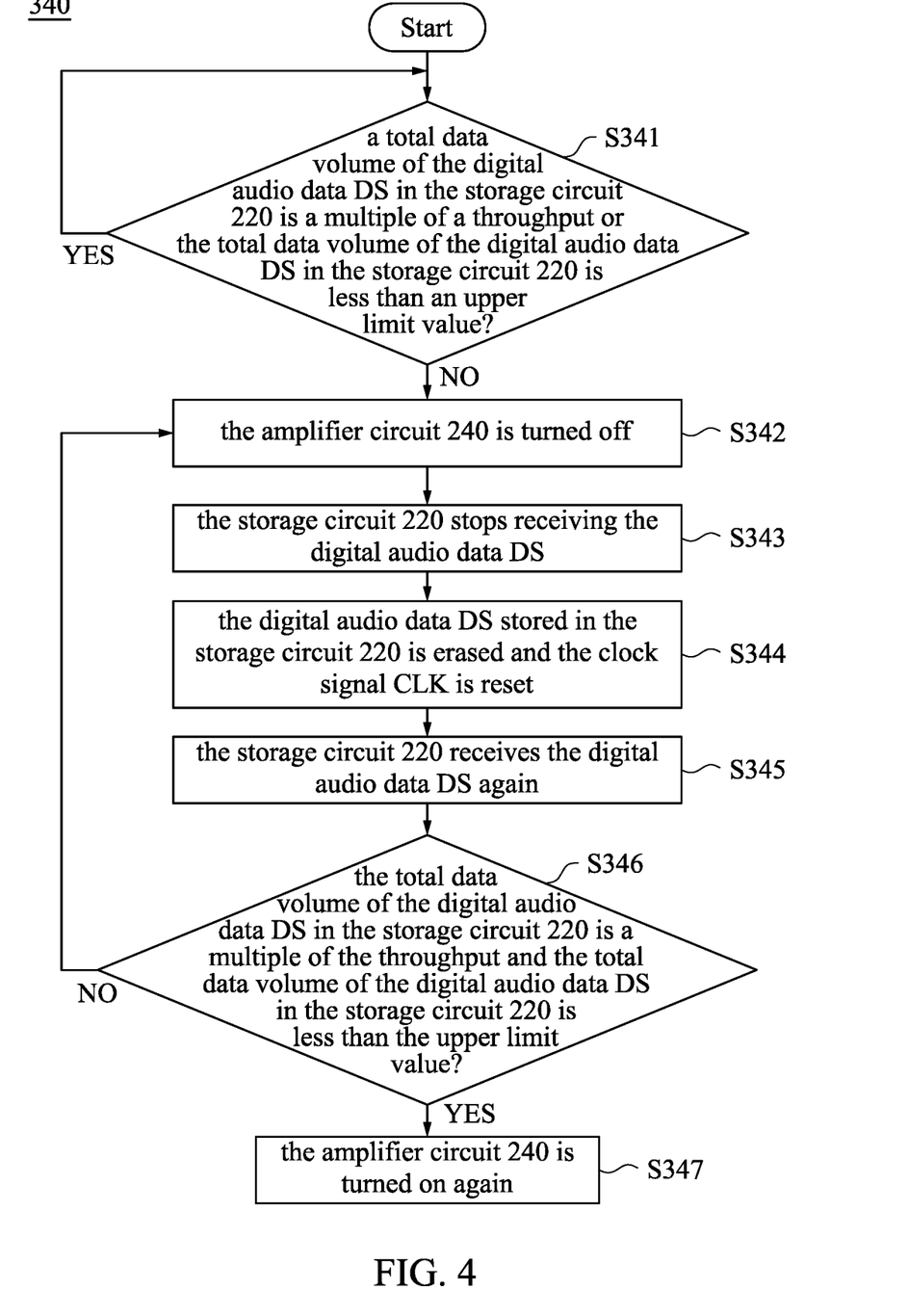
FIG. 4 is a detailed flow diagram illustrating one operation according to some embodiments of the present disclosure.

Reference is made to FIG. 4. FIG. 4 is a detailed flow diagram illustrating the operation S340 according to some embodiments of the present disclosure.

In operation S341, the detector circuit 250 detects whether a total data volume of the digital audio data DS in the storage circuit 220 is a multiple of a throughput or whether the total data volume of the digital audio data DS in the storage circuit 220 is less than an upper limit value.

If the audio processor circuit 200 operates normally, the total data volume of the digital audio data DS in the storage circuit 220 will be a multiple of the throughput, in which the throughput may be a product of a channel number and a transmission bit number. For example, if the audio playing device D3 includes two sound channels (e.g., a left sound channel and a right sound channel) and the transmission bit number of each sound channel (i.e., the transmission bit number) is 24 bits, the throughput is 48 (the product of 2 and 24) bits. In other words, the storage circuit 220 receives a multiple of 48 bits per millisecond.

However, when an abnormal condition occurs (e.g., the electrical device D1 loses one or more bits), it will cause that the total data volume of the digital audio data DS in the storage circuit 220 is not a multiple of 48 bits.

Figure 5:
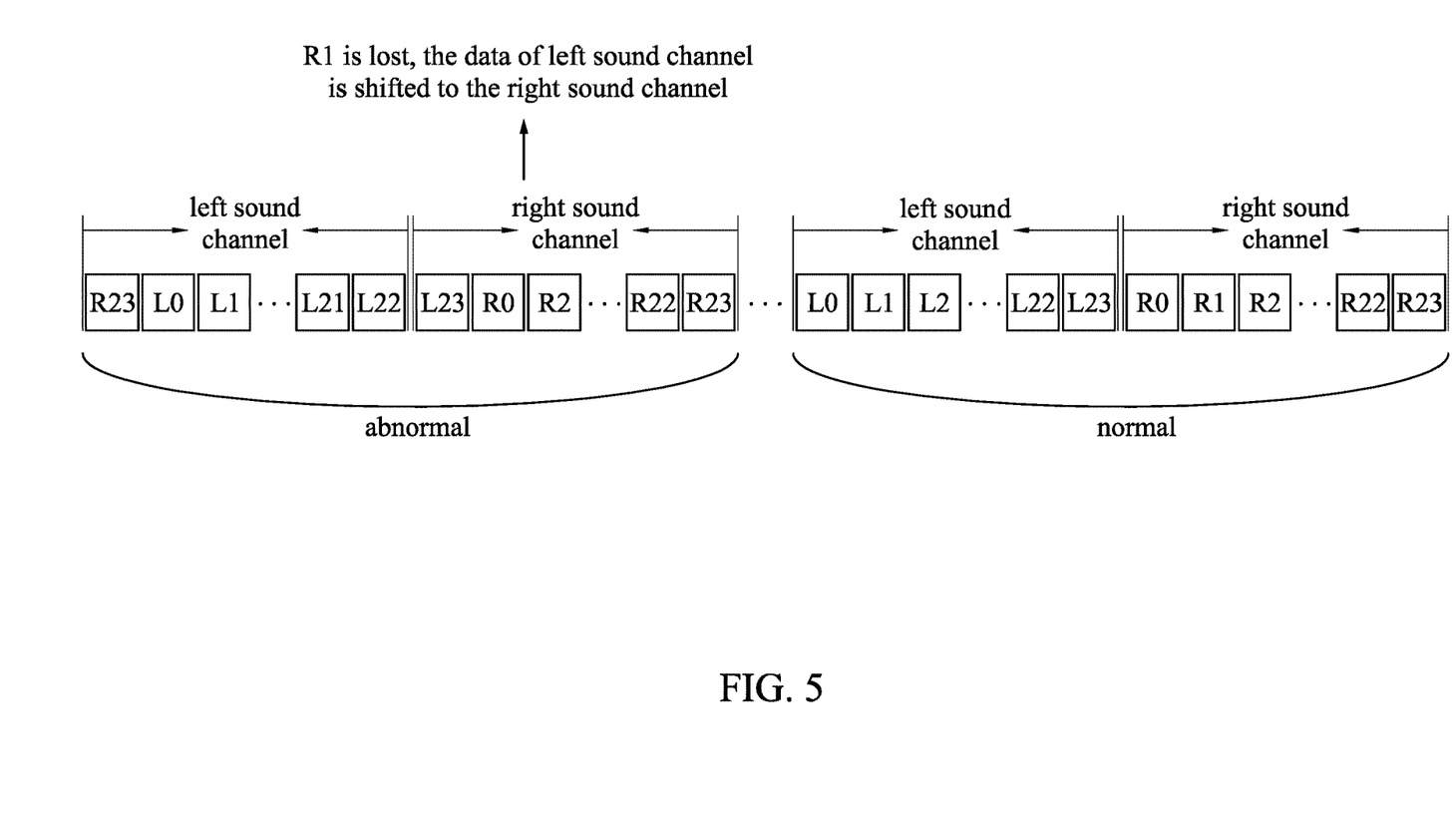
FIG. 5 is a schematic illustrating a normal data transmission procedure and an abnormal data transmission procedure according to some embodiments of the present disclosure.

Reference is made to FIG. 5. FIG. 5 is a schematic illustrating a normal data transmission procedure and an abnormal data transmission procedure according to some embodiments of the present disclosure. For example, under the normal condition, the left sound channel corresponds to 24 bits, e.g., data L0-L23, and the right sound channel corresponds to 24 bits, e.g., data R0-R23. When the abnormal condition occurs (e.g., one or more bits are lost), it will cause sequential errors in the arrangement of the audio data. As illustrated in FIG. 5, the data R1 of the right sound channel is lost, and this causes the data R0 of the right sound channel to be shifted to fill the vacancy of the data R1 of the right sound channel. However, since the data R0 of the right sound channel is shifted to an original position of the data R1 of the right sound channel, the data L23 of the left sound channel is shifted to the right sound channel. Then, the data L22 of the left sound channel is shifted to an original position of the data L23 of the left sound channel, and so on. It causes the arrangement of the data to be wrong and cause the analog audio signal AS passing through the digital-to-analog converter circuit 230 and the amplifier circuit 240 as noise.

In order to avoid affecting the user's hearing experience (e.g., to prevent the user from hearing noise), the control circuit 260 turns off the amplifier circuit 240 under a condition that the total data volume of the digital audio data DS in the storage circuit 220 is not a multiple of the throughput (48 bits), such that the amplifier circuit 240 stops providing the output audio signal OUT to the audio playing circuit 300. In some other embodiments, the control circuit 260 turns off the amplifier circuit 240 under a condition that the total data volume of the digital audio data DS in the storage circuit 220 is not a multiple of 48 bits for a time interval. For example, it is assumed that the digital-to-analog converter circuit 230 receives the digital audio data DS from the storage circuit 220 according to the clock signal CLK corresponding to a sampling period (e.g., 1 millisecond). The aforementioned time interval may be twice (e.g., 2 milliseconds) or more than twice (e.g., more than 2 milliseconds) the sampling period.

In addition, it is assumed that the digital-to-analog converter circuit 230 receives the digital audio data DS from the storage circuit 220 with a sampling period (e.g., 1 millisecond), the total volume per millisecond of the received data received by the storage circuit 220 is equal to a product of one-thousand of the sampling rate, the channel number, and the transmission bit number. Under a normal condition, the storage circuit 220 does not store too much data. However, when an abnormal condition occurs (e.g., the digital-to-analog converter circuit 230 receives the digital audio data DS from the storage circuit 220 abnormally), it causes the storage circuit 220 to store too much data. That is, the total data volume of the audio data stored in storage circuit 220 are overflowed. Accordingly, the control circuit 260 turns off the amplifier circuit 240 under a condition that the total data volume of the digital audio data DS in the storage circuit 220 is equal to or greater than the upper limit value such that the amplifier circuit 240 stops providing the output audio signal OUT to the audio playing circuit 300. In order to avoid misjudgment, the upper limit value may be three times or more than three times a throughput per millisecond (a throughput of the sampling period). For example, in the embodiments where the sampling rate is 48K and each of two sound channels corresponds to 24 bits, the throughput per millisecond (the throughput of the sampling period) is 2×48×24=2304 bits. The upper limit value may be 6912 (a product of 3 and 2304) bits or greater than 6912 (a product of 3 and 2304) bits.

Based on the operations above, if the total data volume of the digital audio data DS in the storage circuit 220 is not a multiple of the throughput or the total data volume of the digital audio data DS in the storage circuit 220 is equal to or greater than the upper limit value (i.e., the determination result of operation S341 is "NO"), it goes to operation S342.

In operation S342, the amplifier circuit 240 is turned off. To be more specific, the control circuit 260 turns off the amplifier circuit 240 such that the amplifier circuit 240 stops providing the output audio signal OUT to the audio playing circuit 300. Then, it goes to operation S343.

In operation S343, the storage circuit 220 stops receiving the digital audio data DS from the electrical device D1. For example, the control circuit 260 controls (disables) the receiver circuit 210 to stop transmitting the digital audio data DS to the storage circuit 220. Then, it goes to operation S344.

In operation S344, the digital audio data DS stored in the storage circuit 220 is erased and the clock signal CLK is reset. For example, the control circuit 260 erases the digital audio data DS stored in the storage circuit 220 and resets the clock signal CLK. Then, it goes to operation S345.

In operation S345, the storage circuit 220 receives the digital audio data DS from the electrical device D1 again. For example, the control circuit 260 controls (enables) the receiver circuit 210 to transmit the digital audio data DS to the storage circuit 220 again in the time interval when the electrical device D1 does not transmit any data. Then, it goes to operation S346.

In operation S346, the detector circuit 250 detects whether the total data volume of the digital audio data DS in the storage circuit 220 is a multiple of the throughput and whether the total data volume of the digital audio data DS in the storage circuit 220 is less than the upper limit value again. If the total data volume of the digital audio data DS in the storage circuit 220 is a multiple of the aforementioned throughput and the total data volume of the digital audio data DS in the storage circuit 220 is less than the aforementioned upper limit value (i.e., the determination result of operation S346 is "YES"), it goes to operations S347. If the determination result of operation S346 is "NO", it returns back to operation S342.

In operation S347, the amplifier circuit 240 is turned on again. For example, the control circuit 260 restarts the amplifier circuit 240 such that the amplifier circuit 240 provides the output audio signal OUT to the audio playing circuit 300 again.

In some application environments, due to some factors (e.g., poor circuit design on a circuit board, impedance mismatch, and unstable power supply/audio data/clock signal), audio data may be lost or overflowed, and thus noise is generated and affects user's hearing experience. In some related approaches, it requires user to replay or replug the audio adapter device D2 to reduce the noise.

Compared to the aforementioned related approaches, the audio processor circuit 200 of the present disclosure can automatically turn off the amplifier circuit 240 under a condition that the total data volume of the digital audio data DS in the storage circuit 220 is not a multiple of the throughput or the total data volume of the digital audio data DS in the storage circuit 220 is equal to or greater than the upper limit value such that the amplifier circuit 240 stops providing the output audio signal OUT to the audio playing circuit 300. Thus, it can prevent the user from hearing noise so as to improve the user's hearing experience.

Figure 6:
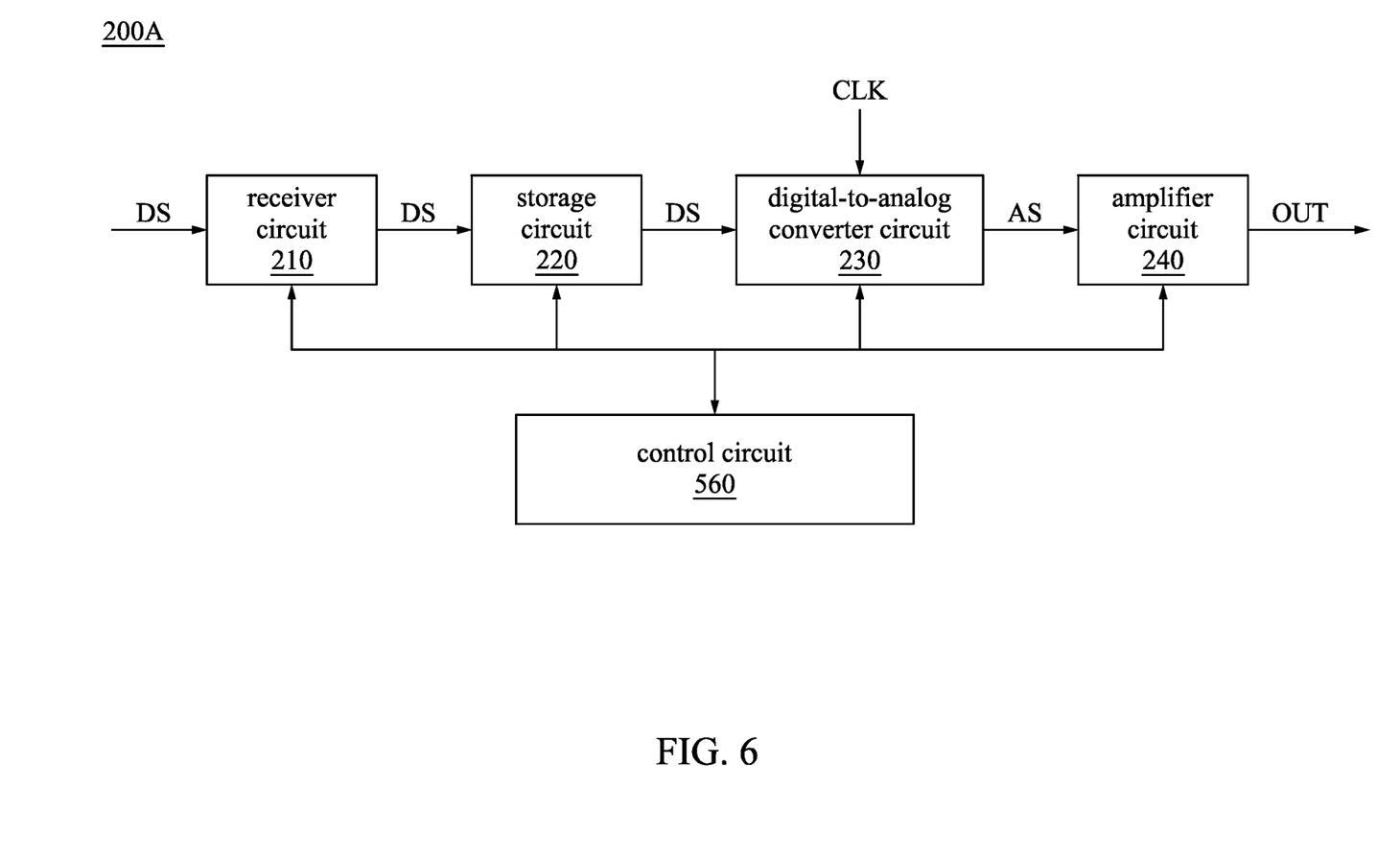
FIG. 6 is a functional block diagram illustrating an audio processor circuit according to some embodiments of the present disclosure.

Reference is made to FIG. 6. FIG. 6 is a functional block diagram illustrating an audio processor circuit 200A according to some embodiments of the present disclosure. In some other embodiments, the aforementioned operations can be executed by firmware. As illustrated in FIG. 6, a control circuit 560 can cooperate with related code to detect and control the receiver circuit 210, the storage circuit 220, the digital-to-analog converter circuit 230, and the amplifier circuit 240. Other operation principles of the audio processor circuit 200A in FIG. 6 are similar to those of the audio processor circuit 200 in FIG. 2, so they are not described herein again.

Figure 7:
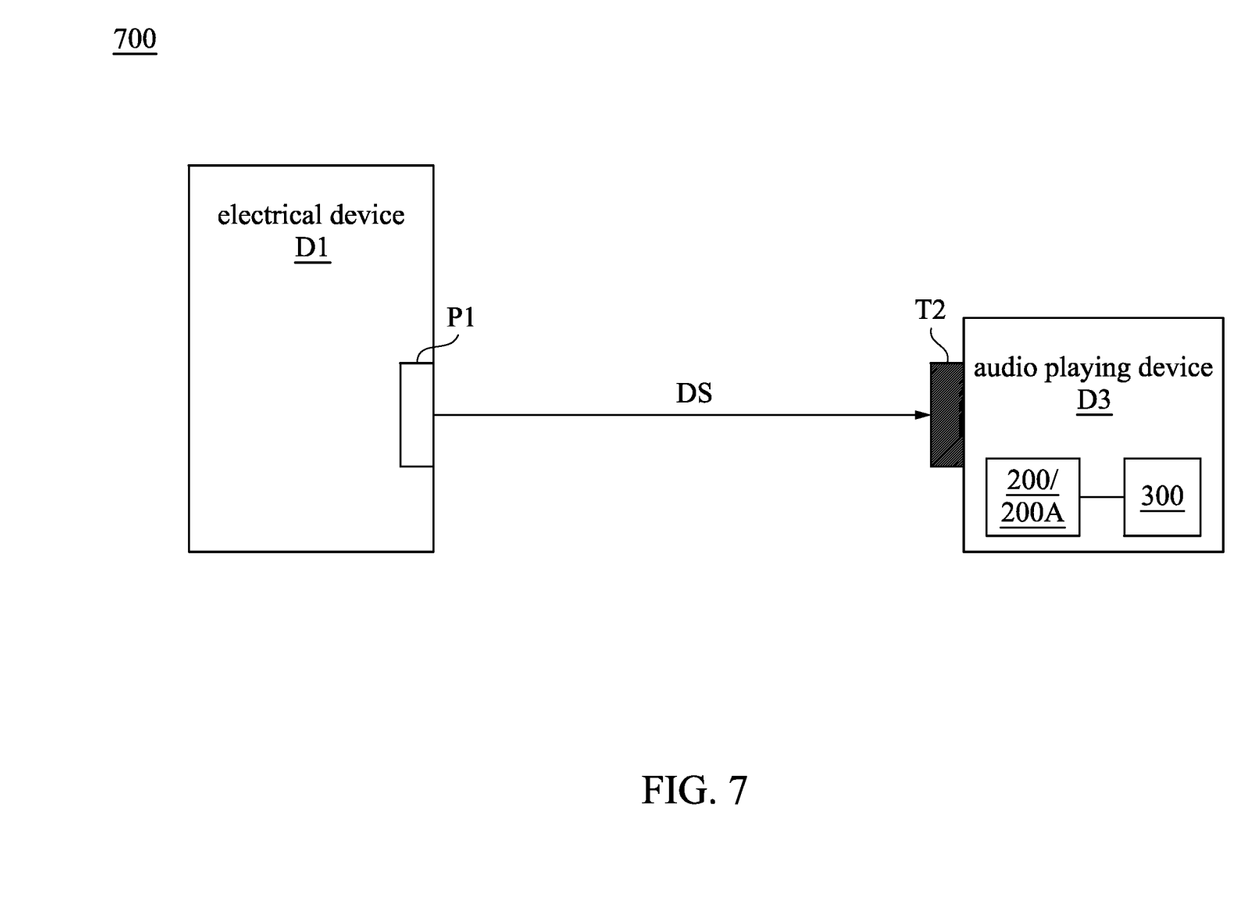
FIG. 7 is a schematic diagram illustrating an audio playing system according to some embodiments of the present disclosure.

Reference is made to FIG. 7. FIG. 7 is a schematic diagram illustrating an audio playing system 700 according to some embodiments of the present disclosure. A major difference between the audio playing system 700 in FIG. 7 and the audio playing system 100 in FIG. 1 is that, the audio processor circuit 200 (or 200A) and the audio playing circuit 300 are integrated together in an audio playing device D3 in FIG. 7. In other words, in FIG. 7, a connection portion T2 of the audio playing circuit 300 can be inserted into a connection portion P1 of the electrical device D1 in order to directly couple the electrical device D1 without a coupled between an audio adapter device (as the audio adapter device D2 shown in FIG. 1) and the electrical device D1. In these embodiments, a type of the connection portion T2 of the audio playing circuit 300 corresponds to the type of the connection portion P1.

The operations of the audio processor circuit 200 (or 200A) in FIG. 7 are similar to those of the audio processor circuit 200 (or 200A) in FIG. 2 (or FIG. 6), so they are not described herein again.

Based on the descriptions above, the audio processor circuit and the audio processing method of the present disclosure can prevent the user from hearing noise so as to improve the user's hearing experience.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code to compile the script into a form that is used for the layout or fabrication of the ultimate circuitry.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An audio processor circuit, comprising:
   a storage circuit configured to store digital audio data from an electrical device;
   a digital-to-analog converter circuit configured to convert the digital audio data from the storage circuit into an analog audio signal; and
   an amplifier circuit configured to provide an output audio signal to an audio playing circuit according to the analog audio signal,
   wherein if a total data volume of the digital audio data stored in the storage circuit is not a multiple of a throughput or the total data volume of the digital audio data stored in the storage circuit is equal to or greater than an upper limit value, the amplifier circuit is turned off such that the amplifier circuit stops providing the output audio signal to the audio playing circuit.

2. The audio processor circuit of claim 1, wherein the throughput is a product of a channel number and a transmission bit number.

3. The audio processor circuit of claim 1, wherein if the total data volume of the digital audio data stored in the storage circuit is not the multiple of the throughput for a time interval, the amplifier circuit is turned off such that the amplifier circuit stops providing the output audio signal.

4. The audio processor circuit of claim 3, wherein the digital-to-analog converter circuit receives the digital audio data from the storage circuit with a sampling period, wherein the time interval is equal to or greater than twice the sampling period.

5. The audio processor circuit of claim 4, wherein the upper limit value is equal to or greater than three times a throughput of the sampling period.

6. The audio processor circuit of claim 1, further comprising:
   a detector circuit configured to detect whether the total data volume of the digital audio data stored in the storage circuit is the multiple of the throughput or whether the total data volume of the digital audio data stored in the storage circuit is less than the upper limit value.

7. The audio processor circuit of claim 1, further comprising:
   a control circuit configured to turn off the amplifier circuit such that the amplifier circuit stops providing the output audio signal, control the storage circuit to stop receiving the digital audio data, erase the digital audio data stored in the storage circuit, reset a clock signal, and control the storage circuit to receive the digital audio data again, wherein the digital-to-analog converter circuit is configured to receive the digital audio data stored in the storage circuit according to the clock signal.

8. The audio processor circuit of claim 7, wherein after the control circuit controls the storage circuit to receive the digital audio data again, if the total data volume of the digital audio data stored in the storage circuit is the multiple of the throughput and the total data volume of the digital audio data stored in the storage circuit is less than the upper limit value, the control circuit turns on the amplifier circuit again.

9. The audio processor circuit of claim 1, wherein the audio processor circuit is disposed in an audio adapter device, the audio playing circuit is disposed in an audio playing device, and the audio adapter device is coupled to between the electrical device and the audio playing device.

10. The audio processor circuit of claim 1, wherein the audio processor circuit and the audio playing circuit are disposed in an audio playing device.

11. An audio processing method, comprising:
    storing, by a storage circuit, digital audio data from an electrical device;
    converting, by a digital-to-analog converter circuit, the digital audio data from the storage circuit into an analog audio signal;
    providing, by an amplifier circuit, an output audio signal to an audio playing circuit according to the analog audio signal; and
    turning off the amplifier circuit such that the amplifier circuit stops providing the output audio signal to the audio playing circuit if a total data volume of the digital audio data stored in the storage circuit is not a multiple of a throughput or the total data volume of the digital audio data stored in the storage circuit is equal to or greater than an upper limit value.

12. The audio processing method of claim 11, wherein the throughput is a product of a channel number and a transmission bit number.

13. The audio processing method of claim 11, further comprising:
    turning off the amplifier circuit such that the amplifier circuit stops providing the output audio signal if the total data volume of the digital audio data stored in the storage circuit is not the multiple of the throughput for a time interval.

14. The audio processing method of claim 13, further comprising:
    receiving, by the digital-to-analog converter circuit, the digital audio data from the storage circuit with a sampling period, wherein the time interval is equal to or greater than twice the sampling period.

15. The audio processing method of claim 14, wherein the upper limit value is equal to or greater than three times a throughput of the sampling period.

16. The audio processing method of claim 11, further comprising:

detecting, by a detector circuit, whether the total data volume of the digital audio data stored in the storage circuit is the multiple of the throughput or whether the total data volume of the digital audio data stored in the storage circuit is less than the upper limit value.

17. The audio processing method of claim 11, further comprising:
   turning off, by a control circuit, the amplifier circuit such that the amplifier circuit stops providing the output audio signal;
   controlling, by the control circuit, the storage circuit to stop receiving the digital audio data;
   erasing, by the control circuit, the digital audio data stored in the storage circuit and resetting, by the control circuit, a clock signal, wherein the digital-to-analog converter circuit is configured to receive the digital audio data stored in the storage circuit according to the clock signal; and
   controlling, by the control circuit, the storage circuit to receive the digital audio data again.

18. The audio processing method of claim 17, further comprising:
   after the control circuit controls the storage circuit to receive the digital audio data again, turning on, by the control circuit, the amplifier circuit again if the total data volume of the digital audio data stored in the storage circuit is the multiple of the throughput and the total data volume of the digital audio data stored in the storage circuit is less than the upper limit value.

19. The audio processing method of claim 11, wherein the storage circuit, the digital-to-analog converter circuit, and the amplifier circuit are disposed in an audio adapter device, the audio playing circuit is disposed in an audio playing device, and the audio adapter device is coupled to between the electrical device and the audio playing device.

20. The audio processing method of claim 11, wherein storage circuit, the digital-to-analog converter circuit, the amplifier circuit, and the audio playing circuit are disposed in an audio playing device.

* * * * *